United States Patent [19]
Imazeki et al.

[11] Patent Number: 5,953,629
[45] Date of Patent: *Sep. 14, 1999

[54] METHOD OF THIN FILM FORMING ON SEMICONDUCTOR SUBSTRATE

[75] Inventors: Nobuya Imazeki, Tsukuba; Masaaki Oda, Yachimata; Izumi Nakayama, Chigasaki, all of Japan

[73] Assignee: Vacuum Metallurgical Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/706,679

[22] Filed: Sep. 6, 1996

[30] Foreign Application Priority Data

Jun. 9, 1995 [JP] Japan ................... 7-254555

[51] Int. Cl.$^6$ ................... H01L 21/44
[52] U.S. Cl. ................... 438/679; 438/672
[58] Field of Search ................... 437/186, 187, 437/188, 192, 245; 427/252, 97; 438/675, 679, 672

[56] References Cited

U.S. PATENT DOCUMENTS

| 4,569,876 | 2/1986 | Nakikta | 428/131 |
| 5,294,567 | 3/1994 | Dorfman | 437/187 |

FOREIGN PATENT DOCUMENTS 04210481  7/1992  Japan .

*Primary Examiner*—Charles Bowers
*Assistant Examiner*—Reneé R. Berry
*Attorney, Agent, or Firm*—Rudnick & Wolfe

[57] ABSTRACT

Ultra fine powder of metal dispersed in organic solvent is applied onto a surface of a semiconductor substrate, and heated to evaporate solvent and to sinter the ultra fine powder of metal. Deep contact holes or via holes, and grooves or trenches in the substrate can be filled up with metal, and the surface of the substrate can be covered with thin metal film.

6 Claims, 5 Drawing Sheets

METHOD OF THIN FILM FORMING ON SEMICONDUCTOR SUBSTRATE

BACKGROUND OF THE INVENTION

1. Field of the Invention

This invention relates to a method of thin film forming on the semiconductor substrate, and more particularly to a method wherein ultra fine powder of metal dispersed in organic solvent is applied to the semiconductor substrate.

2. Description of the Prior Art

In order to get high density of packaging and high degree of integration, a multilayer wiring technique is widely used for semiconductor devices. FIG. 1 is a cross-sectional view of one typical example of multilayer wiring techniques. In this example, a silicon substrate 1 has a first layer 2 of silicon dioxide ($SiO_2$) on one surface. The layer of $SiO_2$ as passivation or insulating material is formed by the Chemical Vapor Deposition (CVD) technique. After the contact hole C which reaches a base wafer B, is bored through the layer 2 by the lithography technique, a first thin film of aluminum (Al) is formed by a sputtering technique, and then a patterned Al wiring 3 is formed by the lithography technique. Further, a second layer 4 of $SiO_2$ is formed by the CVD technique. After the contact hole V which connects one wiring layer with another wiring layer, is bored through the layer 4 by the lithography technique, a second thin film 5 of Al is formed by the sputtering technique.

But, drawbacks are found in the sputtering process of Al to the $SiO_2$ layer which has a contact hole or a via hole FIG. 2 is schematic drawings which give general idea of a common sputtering technique.

FIG. 2A shows flight directions f of Al particles in a sputtering chamber, and FIG. 2B shows thickness distribution of an Al film 14 formed at the contact hole C (similar to the via hole V) in the semiconductor substrate 12. As FIG. 2A shows, a substrate 12 is set apart from an Al target 11 at a distance in the range of 30 mm to 60 mm. A pressure in the chamber is kept in the range of 0.3 Pa to 0.5 Pa, and Al particles sputtered from the target 11 take flight in all directions as indicated by arrows f, They collide with each other repeatedly, and reach the substrate 12. Accordingly, as FIG. 2B shows, Al particles accumulate or deposit on the contact hole C and the $SiO_2$ film. However, they often block entrance of the contact hole C in the substrate 12, resulting in a cavity Q in the contact hole C in spite of flat and good appearance of the surface of substrate 12. This cavity leads to decisive losing of wiring reliability.

Cavity frequently appears when aspect ratio (a/b) of the contact hole C is higher than 1, where a represents a depth, and b represents a diameter of the contact hole C. Generally, a contact hole is made into diameter of less than 1 $\mu$m, that is, of submicron range, and recent high density memory devices has smaller diameter, and aspect ratio of them is over 3. This tendency is the same in sputtering of other metals than Al, at wiring process.

The first way to cope this problem is to heat the semiconductor substrate, after sputtering, to the temperature of 500° C. to make Al to melt and flow in the contact hole to fill up. But, this heating method cannot solve the above-described problem, because Al has high viscosity in molten state.

The second way to solve the problem is to install a collimator in the sputtering chamber. FIG. 3 is the similar schematic drawings to FIG. 2. FIG. 3A shows flight directions f of Al particles in a sputtering chamber, and FIG. 3B shows thickness distribution of Al film 14 formed in existence of collimator 13 in the contact hole C. The collimator 13 is installed between the Al target 11 and the substrate 12, and only Al particles that pass through the collimator 13 and have flight directions f' perpendicular to the substrate 12, can reach the substrate 12, as FIG. 3B shows. By this method, enough amount of Al particles can reach the bottom of the minute contact hole C, but thickness of Al film becomes thin at the side wall of the contact hole C, as FIG. 3C shows, causing wiring troubles, and further the collimator 13 is easy to be choked and shortens cycle time of maintenance.

The third way is a so-called long distance sputtering technique, in which the distance between the Al target 11 and the substrate 12 is set in the range of 120 mm to 300 mm, and a pressure in the sputtering chamber is kept relatively so low as $10^{-2}$ Pa, to avoid collision of Al particles, and increase the ratio of Al particles which have the flight direction perpendicular to the substrate 12. When Al target material is sputtered by this technique to the substrate 12 which has relatively larger diameter, it is difficult to keep uniformity of thickness of Al film between the central part and periphery part of the substrate 12.

In addition to the defects on the above described film-forming method, the following defects are found: In common sputtering technique, only 20% to 25% of particles sputtered from target reach the substrate to deposit, and the residue, 80% to 75% of particles sputtered deposits on any other place than the substrate. On the other hand, in the long distance sputtering technique, which uses the collimator 13, deposition ratio to the substrate falls down, and as the result, loss of raw target material increases, productivity of a sputtering apparatus goes down, and sputtering cost increases.

A film forming process by CVD technique also has the same problems in filling up the via hole or contact hole that has high aspect ratio. Further, only 5% to 6% of raw material gases is converted to a film, and loss of raw material in the CVD process is larger than in the sputtering process.

Other than the above described method, a thin metal film forming method by a paste in which ultra fine powder of metal is dispersed in an organic solvent, was disclosed by the Japanese Patent Opening Gazette No. 281783/1991, assigned to the same assignee as that of this application. This discloses a wiring method for a printed-circuit board, a thermal head, or a capacitor, in which powder paste is applied by the screen-printing technique in all of the embodiments disclosed by the Gazzette. In other words, it neither discloses nor suggests a thin metal film forming method to a semiconductor substrate.

SUMMARY OF THE INVENTION

Accordingly, it is an object of this invention to provide a method of thin film forming on the semiconductor substrate that has contact holes or via holes of high aspect ratio, and grooves or trenches in which the ratio of (depth/width) is nearly equal to one in cross-section, filling up these holes and grooves with metal, accompanying no cavity, and covering the surface of the substrate with a thin metal film.

Another object of this invention is to provide a method of thin film forming at low cost and high productivity.

In accordance with an aspect of this invention, a method of thin film forming on the semiconductor substrate comprises steps of:

A method of thin film forming on semiconductor substrate, comprising the steps of:

(A) applying the dispersion in which ultra fine powder of metal, particle size of which is in the range of 0.001 $\mu$m to 0.1 μm, dispersed in organic dispersion medium, on the semiconductor substrate, in which via hole, or contact hole is formed, aspect ratio of which is 1 to 100, or groove or trench is formed in which ratio of depth/width is nearly equal to one in cross-section; and (B) heating said semiconductor substrate to evaporate said organic dispersion medium, to sinter said ultra fine powder of metal, and consequently to fill up said via hole, or said contact hole, or said groove with metal, and to cover the surface of the semiconductor substrate with thin and flat film of said metal.

The foregoing and other objects, features, and advantages of the present invention will be more readily understood upon consideration of the following detailed description of the preferred embodiments of the invention, taken in conjunction with the accompanying drawings.

BRIEF DESCRIPTION OF THE DRAWINGS

FIG. 2 is schematic drawings which give general idea of common sputtering technique.

FIG. 3 is the same schematic drawings as FIG. 2.

FIG. 4A shows a silicon substrate which has via hole bored. FIG. 4B shows a state of the substrate to which dispersion of ultra fine powder of metal is applied. FIG. 4C shows a state of the substrate in which the via hole is filled up and the surface is covered by metal;

DESCRIPTION OF THE PREFERRED EMBODIMENTS

The invention will be explained by the following embodiments with reference to the drawings.

Embodiment 1

Ultra fine powder of gold (Au), having the independent particles, size of which is 0.01 μm in diameter, was dispersed in α-terpineol with surfactant, to get dispersion which was composed of 45 weight % Au, 1 weight % surfactant, 54 weight % α-terpineol, being transparent or translucent.

Figure 1:
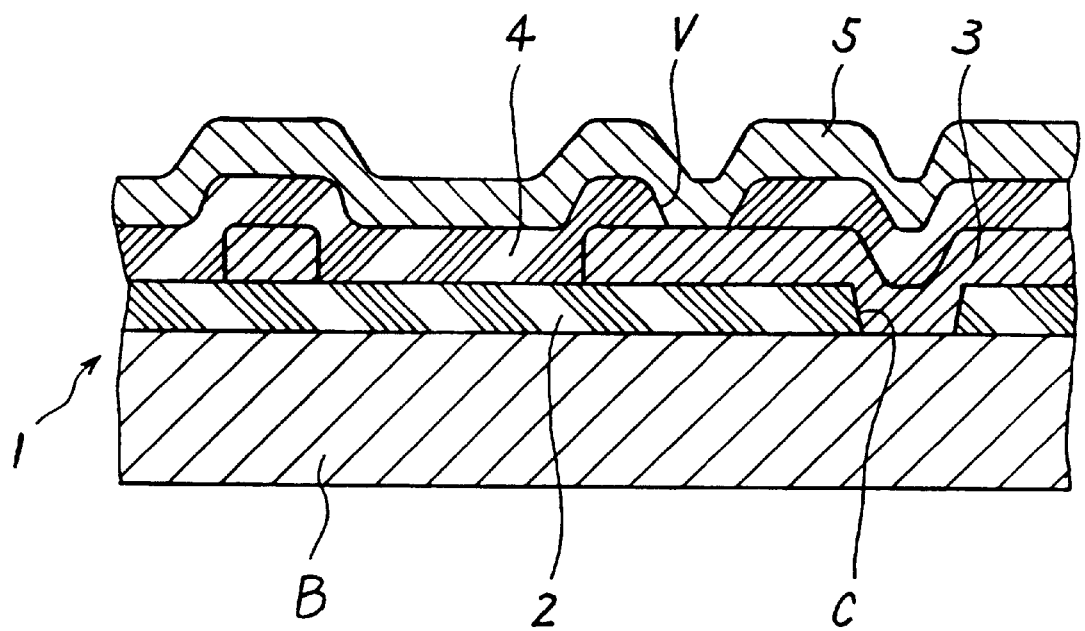
FIG. 1 shows a cross-sectional view of typical multilayer wiring in semiconductor device.
Figure 2A:
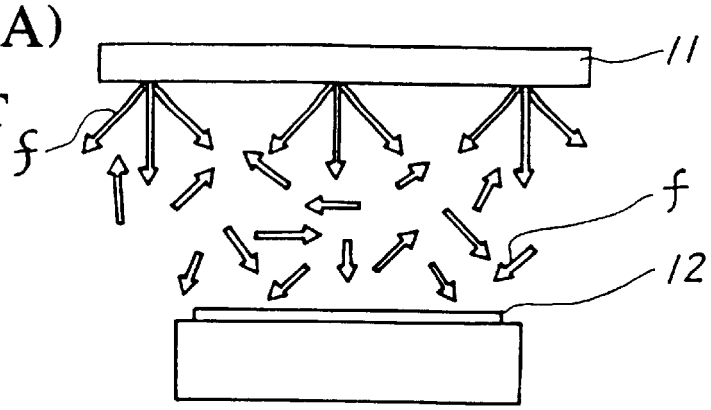
FIG. 2A shows flight direction of Al particles in a sputtering chamber.
Figure 2B:
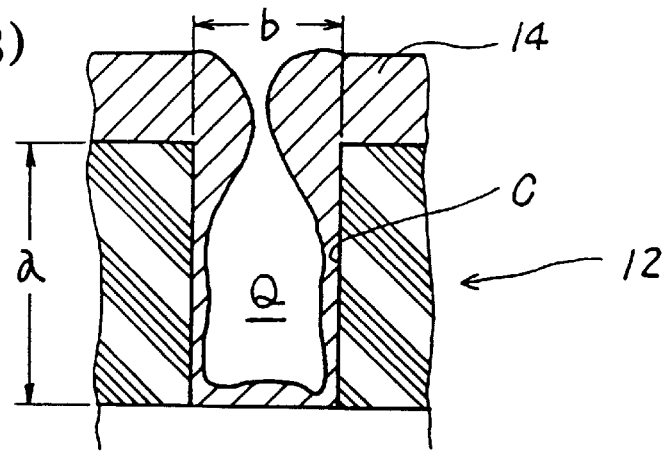
FIG. 2B shows thickness distribution of Al film formed at the contact hole C in the substrate.
Figure 3A:
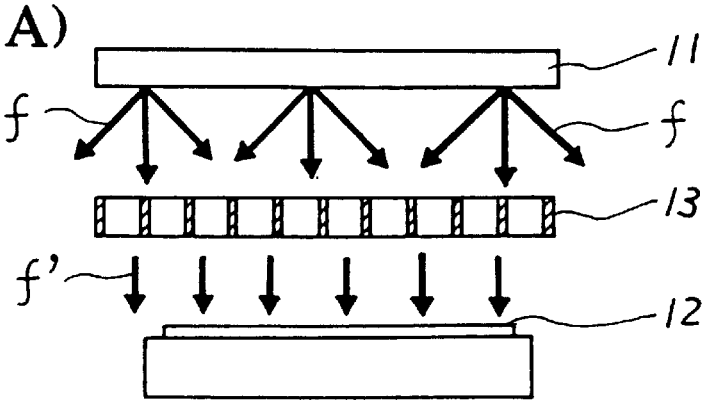
FIG. 3A shows flight directions of Al particles in a sputtering chamber in which a collimator is installed.
Figure 3B:
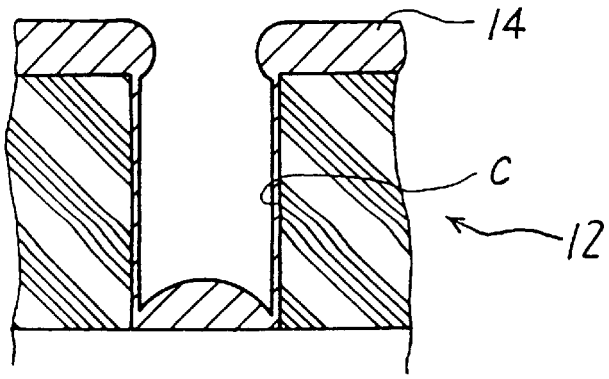
FIG. 3B shows thickness distribution of Al film formed in the contact hole C, in existence of the collimator.
Figure 4:
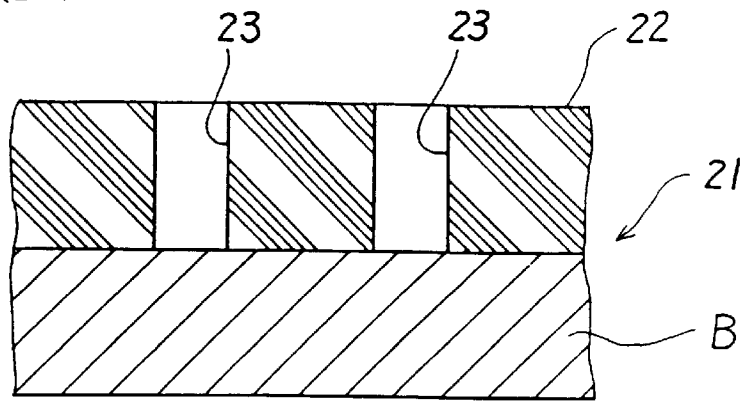
FIG. 4 shows a cross-sectional view of silicon substrate at three steps of thin film forming process according to Embodiment 1 of this invention.
Figure 4:
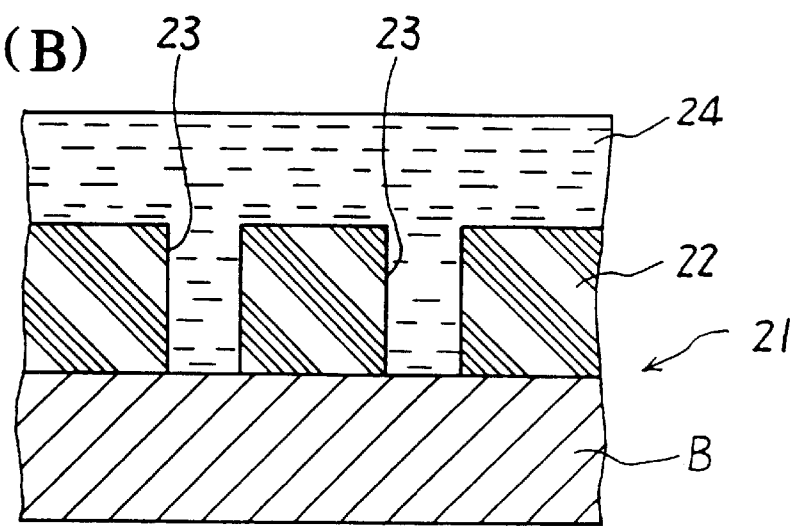
Figure 4:
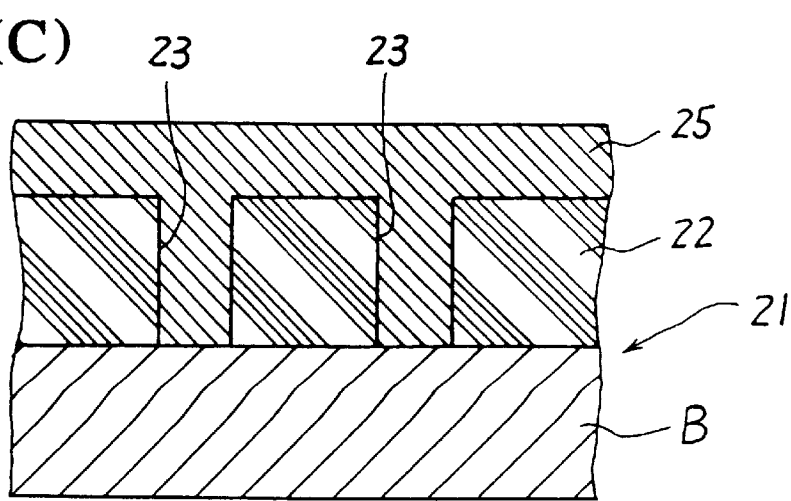

Referring to FIG. 4, a silicon substrate 21 was prepared. A silicon dioxide ($SiO_2$) film 22 as passivation or insulating material was formed on a silicon wafer B, and via holes 23 were bored in the $SiO_2$ film 22. The size of the via hole 23 was 0.5 μm in diameter and 1.0 μm in depth, namely aspect ratio is 2.0, and the surface of the substrate 21, including the inside wall and bottom surface of the via hole 23, was slightly pre-sputtered previously with nickel (Ni) in order to get higher adhesion strength to Au to be applied.

The substrate 21 was set in a spin coater although not shown, rotated at the speed of 1500 r.p.m., and then the dispersion of the above-described Au was dripped dropwise onto the surface of the substrate 21 from the above to get the substrate 21 shown in FIG. 4B. Namely, the substrate 21 in FIG. 4B had the via hole 23 filled with the dispersion, and the surface of the substrate 21 was covered with the flat liquid film 24 of the dispersion.

Further, the substrate 21 in the state shown in FIG. 4B was heated at the temperature of 300° C. to evaporate the organic solvent α-terpineol and the surfactant, and to sinter the ultra fine powder of Au, and then cooled. This heating made the substrate 21, as shown in FIG. 4C. Namely, the substrate 21 in FIG. 4C had the via hole 23 filled up with the solid Au, developing no cavity, and the surface of the substrate 21 was covered with the flat and thin solid Au film 25. If required, the thin film 25 can be fabricated into a wiring pattern by the lithography technique.

In the Embodiment 1, the concentration of ultra fine powder of Au in the dispersion was 45 weight %, and the same results were obtained at the concentration of 20 weight % and 70 weight % as of 45 weight %.

The method of thin film forming by applying the dispersion of ultra fine powder of Au to the silicon substrate 21 in Embodiment 1 has no need to use vacuum apparatus which is required at a thin film forming process by sputtering or CVD techniques, so the cost of equipment in the case of this invention is much lower than that of the other techniques. Furthermore, overflowed dispersion from the substrate 21, when applied by the spin coater, can be recovered and applied again to another substrate, therefore, loss of raw materials is little. Based on these facts, the metal film can be formed on the substrate at very low cost by the dispersion application technique as above mentioned, according to this invention.

Embodiment 2

Ultra fine powder of Au, having independent particles, size of which is 0.01 μm in diameter, and ultra fine powder of copper (Cu), having independent particles, size of which is 0.02 μm in diameter, were blended with each other at weight ratio of Au/Cu=95/5, then dispersed in α-terpineol with surfactant. The dispersion was composed of 25 weight % (Au/Cu=95/5), 1 weight % surfactant, and 74 weight % α-terpineol.

The same silicon substrate 21 having the via hole 23 of the aspect ratio 2, as used in Embodiment 1, as shown in FIG. 4, was prepared. But, the surface of the substrate 21, including the inside wall and bottom surface of the hole 23 was not pre-sputtered with Ni. This substrate 21 was set on the spin coater, rotated at the speed of 1500 r.p.m., and then, on the surface of the substrate 21, the dispersion of (Au/Cu=95/5) as above described, was dripped dropwise. Therefore, the via hole 23 was filled with the dispersion of (Au/Cu=95/5), and the surface of the substrate 21 was covered with the liquid film of the dispersion of (Au/Cu=95/5).

The substrate 21 in this state was heated up to the temperature of 300° C. to evaporate α-terpineol and the surfactant and to sinter the (Au/Cu=95/5) ultra fine powder. After cooling, the via hole 23 in the substrate 21 was filled up with the solid (Au/Cu=95/5), accompanying no cavity, and the surface of the substrate 21 was covered with the thin (Au/Cu=95/5) film. This (Au/Cu=95/5) alloy was more resistant to peeling off from the inside wall of the via hole 23, which is not pre-sputtered with Ni, as compared with the pure Au in Embodiment 1.

Embodiment 3

Ultra fine powder of silver (Ag), having independent particles, size of which is 0.008 $\mu$m in diameter, was dispersed in xylene with surfactant, and the dispersion was composed of 30 weight % Ag, 1 weight % surfactant, and 69 weight % xylene. After that, silane coupling agent (silicone compound) is added, and mixed at weight ratio of (the dispersion of Ag ultra fine powder/silane coupling agent)= 95/5.

While, the silicon substrate 21, the surface of which is not pre-sputtered with Ni, similar to the substrate 21 in Embodiment 2, was set on the spin coater, and rotated at the speed of 1500 r.p.m., the mixed dispersion as above mentioned was dripped dropwise onto the surface of the substrate 21. Therefore, the via hole 23 was filled with the mixed dispersion, and the surface of the substrate 21 was covered with the liquid film of the mixed dispersion.

The substrate 21 in this state was heated up to the temperature of 300° C. to evaporate xylene and the surfactant, and to sinter the Ag ultra fine powder in the mixture, and then cooled.

The via hole 23 in the substrate 21 was filled up with the solid (Ag·$SiO_2$) mixture with no cavity, and the surface of the substrate 21 was covered with thin (Ag·$SiO_2$) mixture film. This (Ag·$SiO_2$) mixture was more resistant to peeling off from the inside wall of the via hole 23, the surface of which was not pre-sputtered with Ni, as compared with the pure Ag, and the (Ag·$SiO_2$) showed the same adhesion strength as the (Au/Cu=95/5) alloy in Embodiment 2.

Embodiment 4

Ultra fine powder of Cu, having independent particles, size of which is 0.02 $\mu$m in diameter, was dispersed in toluene with surfactant, and the dispersion was composed of 35 weight % Cu, 1 weight % surfactant, and 64 weight % toluene, being transparent or translucent.

Figure 5:
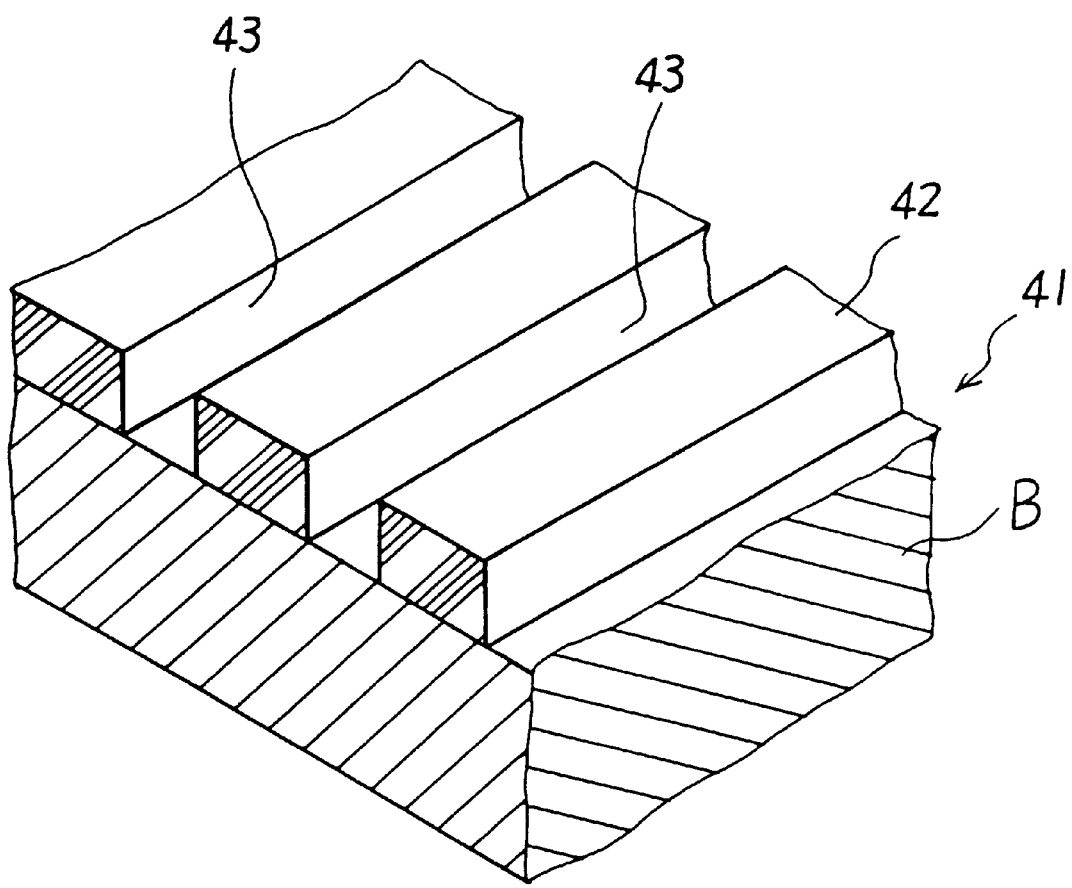
FIG. 5 shows a perspective view of partially cut-away substrate used in Embodiment 3 of this invention; in which patterned grooves are formed.

A silicon substrate 41, as shown in FIG. 5, was prepared. Namely, a thin $SiO_2$ film 42 as passivation or insulating material on the surface of the silicon substrate 41 has grooves 43 formed in pattern shape, and the size of which is 0.5 $\mu$m in width, and 0.5 $\mu$m in depth, and the surface of the substrate 41, including the inside wall of the grooves 43 was pre-sputtered thin with Ni.

After dipped into the dispersion of Cu ultra fine powder, the substrate 41 was pulled up at the speed of 0.5 cm/sec to 5 cm/sec. Consequently, the grooves 43 in pattern shape were filled with the dispersion of Cu ultra fine powder, and the surface of the substrate 41 was covered with the liquid film of the dispersion of Cu ultra fine powder.

The substrate 41 in this state was loaded in the electric furnace kept in nitrogen gas atmosphere, and heated at the temperature of 100° C. to evaporate almost toluene, and then heated at the temperature of 300° C. to evaporate residual toluene and the surfactant, and to sinter Cu ultra fine powder, and after that, the substrate 41 was cooled.

The grooves 43 in the substrate 41 were filled up with the solid Cu, accompanying no cavity, and the surface of the substrate 41 was covered with the thin Cu film.

While the preferred Embodiments have been described, variations thereto will occur to those skilled in the art within the scope of the present inventive concepts which are delineated by the following claims.

For example, in the Embodiments as above mentioned, Au, Cu and Ag are used as raw metal of ultra fine powder. However, besides these, aluminum (Al), indium (In), zinc (Zn), nickel (Ni), palladium (Pd), platinum (Pt), cobalt (Co), rhodium (Rh), iridium (Ir), iron (Fe), ruthenium(Ru), osmium (Os), chromium (Cr), tungsten (W), tantalum (Ta), titanium (Ti), bismuth (Bi), lead (Pb), boron (B), silicon (Si), tin (Sn), and barium (Ba) may be used individually, or in any combination of them.

Further, particle size of ultra fine powder of these metals is preferable in the range of 0.001 $\mu$m to 0.1 $\mu$m, and each particle is preferable to be independent, or free from aggregation.

A manufacturing method of these ultra fine powder has been disclosed by the Japanese Patent Opening Gazette No.34211/1991, assigned to the same assignee as that of this application. Much smaller particle size of ultra fine powder dispersed than the wave length of visible light makes the dispersion be transparent or translucent, and independent particles of ultra fine powder make themselves be able to be dispersed at high concentration in organic dispersion medium.

Further, in all of the Embodiments as above mentioned, α-terpineol, xylene or toluene is used as organic dispersion medium for ultra fine powder of metal. In addition to them, hydrocabons, alcohols, esters, ethers, and ketones, carbon number of which is over 5, can be used individually, or in any combination of them. Still more, to the dispersion, a surfactant may be added, as the occasion demands, and frit may be added to increase the adhesion strength to a semiconductor substrate.

Further, in all of the Embodiments as above mentioned, the dispersions of ultra fine powder are applied by the spin coater or the dipping technique. However, besides these, spraying from the nozzle, for example, may be adopted.

Further, in Embodiment 4, the electric furnace kept in nitrogen atmosphere was used to avoid oxidation of Cu film in heating operation. In similar consideration, protection of the semiconductor substrate from moisture or oxygen, before or during process of application of dispersion, is preferable. The surface of the semiconductor substrate, and the inner surface of the various kinds of holes bored in the substrate are often pre-etched by argon ion ($Ar^+$). In such a case, processes following the pre-etching, for example, carriage of the substrate, application of the dispersion of ultra fine powder of metal to the substrate, and film formation by heating the substrate may be preferably carried out in an atmosphere of high vacuum, or of inert gas such as nitrogen.

Further, in all of the Embodiments as above mentioned, the via hole, the contact hole, or the grooves, aspect ratio of which is 1 to 2, are exemplified. Since the surface tension of organic dispersion medium is relatively low, the dispersion can fill up the holes in no relation to magnitude of aspect ratio, and even a hole of extremely small diameter, for example, aspect ratio of which is about 100, can be filled up with no problem, according to this invention.

Further, in Embodiment 1, two via holes 23 of equal aspect ratio bored in $SiO_2$ film 22 were exemplified. However in addition to these holes 23, such various kinds of holes bored in the semiconductor substrates as shown in FIG. 6 can be filled up with the dispersion of ultra fine powder of metal, according to this invention.

Figure 6A:
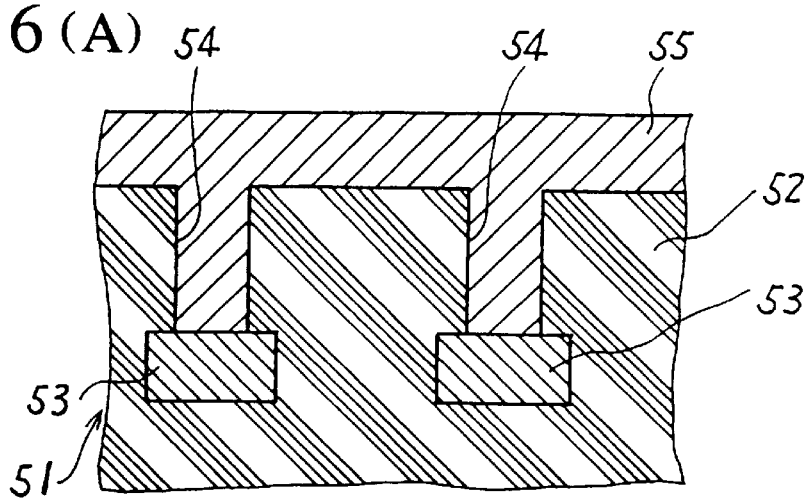
FIG. 6 shows cross-sectional views of several kinds of holes in a semiconductor substrate, to which dispersion of ultra fine powder of metal has been applied, and thin film has been formed.

FIG. 6A is a part of cross-sectional view of one application example 51. The dispersion of ultra fine powder of metal is applied to a $SiO_2$ film 52, which has two via holes 54 bored to reach metal wirings 53 in the $SiO_2$ film 52. The via holes 54 are filled up with metal, and the surface of $SiO_2$ film 52 is covered with thin metal film 55. This example is similar to Embodiment 1.

Figure 6B:
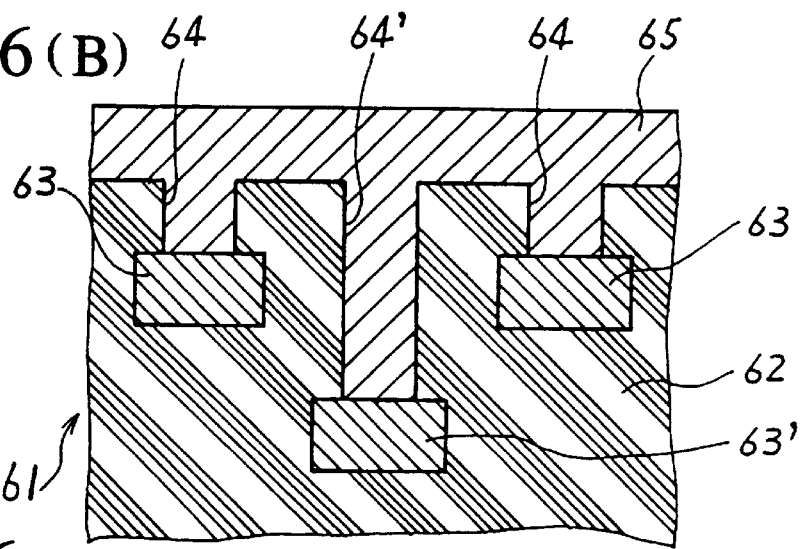

FIG. 6B is a part of cross-sectional view of another application example 61. The dispersion of ultra fine powder of metal is applied to a SiO$_2$ film 62, which has two via holes 64 of aspect ratio 1 bored to reach metal wirings 63, and one via hole 64' of aspect ratio 3 bored to reach a metal wiring 63'. The position of metal wiring 63' in SiO$_2$ film 62 is deeper than that of metal wiring 63. These via holes 64 and 64' are filled up with metal at the same time, indicating no sign of cavity, and the surface of SiO$_2$ film 62 is covered with thin metal film 65.

Figure 6C:
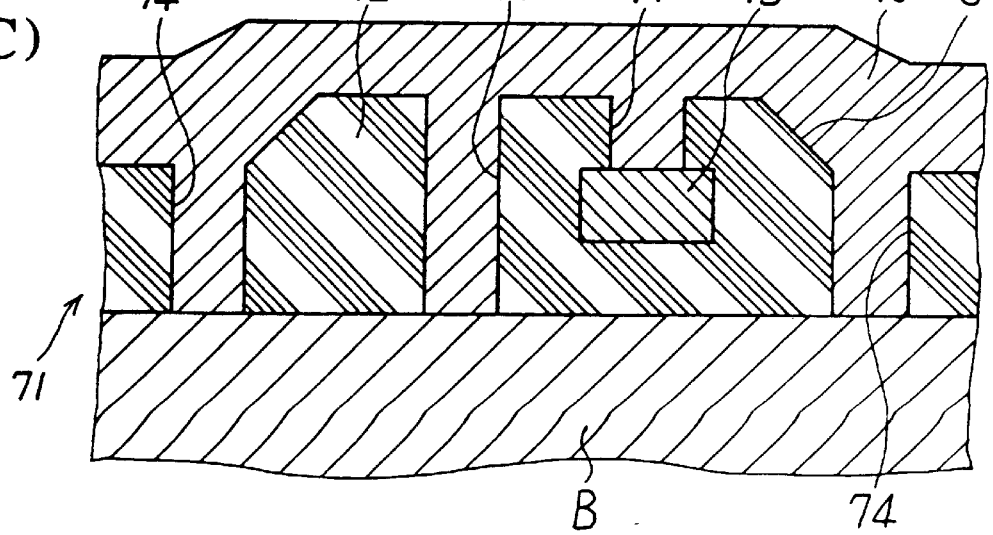

FIG. 6C is a part of cross-sectional view of a further application example 71. The dispersion of ultra fine powder of metal is applied to a SiO$_2$ film 72 formed in the silicon substrate 71. A SiO$_2$ film 72 has contact holes 74 and 74', aspect ratios of which are different from each other, and a via hole 74" bored to reach a metal wiring 73 in the SiO$_2$ film 72, and uneven surface U as shown. These via holes 74, 74' and contact hole 74" are filled up with metal, accompanying no cavity, and the surface of SiO$_2$ film 72 is covered with nearly flat and smooth metal film 75, according to this invention.

Further, at all of the Embodiments as above mentioned, filling up of various holes and grooves with metal is done by applying the dispersion. Instead of this method, thin metal film forming on the inside wall surface of the holes and grooves may be done.

Further, at Embodiment 3, silane coupling agent was added to the dispersion of ultra fine powder of Ag, and the via hole 23 in the substrate 21 was filled up with (Ag.SiO$_2$) mixture and the surface of the substrate 21 was covered with thin (Ag SiO$_2$) mixture film. And, (Ag.SiO$_2$) mixture showed high adhesion strength to the inside wall of the via hole 23 bored in the SiO$_2$ film 22. However, adhesion strength of metal (raw metal of ultra-fine powder) to the substrate can be improved by mixing with metal compounds containing at least one metal selected from the group consisting of Au, Cu, Ag, Al, In, Zn, Ni, Pd, Pt, Co., Rh, Ir, Fe, Ru, Os, Cr, W, Ta, Ti, Bi, Pb, B, Sn, and Ba. It or they can be mixed successfully to increase adhesion strength.

What is claimed is:

1. A method of thin film forming on a semiconductor substrate, said semiconductor substrate having a via hole, wherein the aspect ratio of which is 1 to 100, or trench formed therein in which the ratio of depth/width is nearly equal to one in cross section, comprising the steps of: providing a liquid organic dispersion medium, dispersing in said medium an ultra fine powder of metal having a particle size in the range of 0.001 µm to 0.1 µm, applying said liquid dispersion to said semiconductor substrate by one of the techniques selected from the group consisting of spin coating, dipping and spraying to fill said via hole, or said trench with said liquid dispersion; and heating said semiconductor substrate to evaporate said organic dispersion medium and to sinter said ultra fine powder of metal, and to fill said via hole, or said trench with said metal, and to cover the surface of said semiconductor substrate with a thin and planar film of said metal.

2. The method of thin film forming on said semiconductor substrate according to claim 1, in which said metal is at least one metal selected from the group consisting of gold, silver, copper, aluminum, indium, zinc, nickel, palladium, platinum, cobalt, rhodium, iridium, iron, ruthenium, osmium, chromium, tungsten, tantalum, titanium, bismuth, lead, boron, silicon, tin, and barium.

3. The method of thin film forming on said semiconductor substrate according to claim 1 or 2, in which said metal is mixed with metal compound, containing at least one metal selected from the group consisting of gold, silver, copper, aluminum, indium, zinc, nickel, palladium, platinum, cobalt, rhodium, iridium, iron, ruthenium, osmium, chromium, tungsten, tantalum, titanium, bismuth, lead, boron, silicon, tin, and barium.

4. The method of thin film forming on said semiconductor substrate according to claim 1, in which said organic dispersion medium is at least one organic solvent selected from the group consisting of hydrocarbons, alcohols, esters, ethers, and ketones, carbon number of which is more than 5.

5. The method of thin film forming on said semiconductor substrate according to claim 1, in which said semiconductor substrate applied with said dispersion is heated in an atmosphere of inert gas, or of vacuum.

6. The method of thin film forming on said semiconductor substrate according to claim 1, in which said dispersion is applied to said semiconductor substrate which has been kept in an atmosphere of inert gas after pre-etched.

* * * * *

UNITED STATES PATENT AND TRADEMARK OFFICE
CERTIFICATE OF CORRECTION

PATENT NO. : 5,953,629
DATED : September 14, 1999
INVENTOR(S) : Nobuya Imazeki, Masaaki Oda and Izumi Nakayama It is certified that error appears in the above-identified patent and that said Letters Patent are hereby corrected as shown below:

Col. 1, line 30: insert "." after "hole"

Col. 7, line 43: insert "a" before "trench"

Signed and Sealed this

Tenth Day of April, 2001

Attest:

NICHOLAS P. GODICI

*Attesting Officer*  *Acting Director of the United States Patent and Trademark Office*